United States Patent
Varghese et al.

(10) Patent No.: US 9,601,652 B2
(45) Date of Patent: *Mar. 21, 2017

(54) OHMIC N-CONTACT FORMED AT LOW TEMPERATURE IN INVERTED METAMORPHIC MULTIJUNCTION SOLAR CELLS

(71) Applicant: SolAero Technologies Corp., Albuquerque, NM (US)

(72) Inventors: Tansen Varghese, Albuquerque, NM (US); Arthur Cornfeld, Sandia Park, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 143 days.

This patent is subject to a terminal disclaimer.

(21) Appl. No.: 14/625,314

(22) Filed: Feb. 18, 2015

(65) Prior Publication Data

US 2015/0162485 A1 Jun. 11, 2015

Related U.S. Application Data

(60) Continuation of application No. 14/284,909, filed on May 22, 2014, now Pat. No. 8,987,042, which is a
(Continued)

(51) Int. Cl.
*H01L 31/18* (2006.01)
*H01L 31/0224* (2006.01)
(Continued)

(52) U.S. Cl.
CPC .... *H01L 31/1844* (2013.01); *H01L 31/02008* (2013.01); *H01L 31/022425* (2013.01);
(Continued)

(58) Field of Classification Search
CPC ....... H01L 31/02008; H01L 31/022425; H01L 31/06875; H01L 31/0725; H01L 31/0735; H01L 31/078; H01L 31/1844; Y02E 10/544
See application file for complete search history.

(56) References Cited

U.S. PATENT DOCUMENTS 3,488,834 A 1/1970 Baird
3,964,155 A 6/1976 Leinkram et al.
(Continued)

FOREIGN PATENT DOCUMENTS

CN 101521238 9/2009
EP 1 109 230 6/2001
(Continued)

OTHER PUBLICATIONS

U.S. Appl. No. 12/265,113, filed Nov. 5, 2008, Varghese.
(Continued)

*Primary Examiner* — Mary Wilczewski

(57) ABSTRACT

A method of forming a multijunction solar cell including an upper subcell, a middle subcell, and a lower subcell by providing a substrate for the epitaxial growth of semiconductor material; forming a first solar subcell on the substrate having a first band gap; forming a second solar subcell over the first solar subcell having a second band gap smaller than the first band gap; forming a graded interlayer over the second subcell, the graded interlayer having a third band gap greater than the second band gap; forming a third solar subcell over the graded interlayer having a fourth band gap smaller than the second band gap such that the third subcell is lattice mismatched with respect to the second subcell; and forming a contact composed of a sequence of layers over the first subcell at a temperature of 280° C. or less and having a contact resistance of less than $5\times10^{-4}$ ohms-cm$^2$.

20 Claims, 21 Drawing Sheets

Related U.S. Application Data continuation of application No. 13/603,088, filed on Sep. 4, 2012, now Pat. No. 8,753,918, which is a division of application No. 12/218,582, filed on Jul. 16, 2008, now abandoned.

(51) Int. Cl.
    *H01L 31/0687*     (2012.01)
    *H01L 31/0725*     (2012.01)
    *H01L 31/0735*     (2012.01)
    *H01L 31/078*     (2012.01)
    *H01L 31/02*     (2006.01)

(52) U.S. Cl.
CPC ...... *H01L 31/06875* (2013.01); *H01L 31/078* (2013.01); *H01L 31/0725* (2013.01); *H01L 31/0735* (2013.01); *Y02E 10/544* (2013.01)

(56) References Cited

U.S. PATENT DOCUMENTS

| | | | | |
|---|---|---|---|---|
| 3,965,279 | A * | 6/1976 | Levinstein | H01L 21/283 257/E21.159 |
| 4,001,864 | A | 1/1977 | Gibbons | |
| 4,011,583 | A * | 3/1977 | Levinstein | H01L 21/28575 148/DIG. 18 |
| 4,173,495 | A | 11/1979 | Rapp et al. | |
| 4,255,211 | A | 3/1981 | Fraas | |
| 4,338,480 | A | 7/1982 | Antypas et al. | |
| 4,393,576 | A | 7/1983 | Dahlberg | |
| 4,593,307 | A * | 6/1986 | Rupprecht | H01L 21/28575 148/DIG. 140 |
| 4,612,408 | A | 9/1986 | Moddel et al. | |
| 4,876,211 | A * | 10/1989 | Kanber | H01L 29/93 257/595 |
| 4,881,979 | A | 11/1989 | Lewis | |
| 4,989,065 | A * | 1/1991 | Tsuchimoto | H01L 21/28575 257/745 |
| 5,011,782 | A * | 4/1991 | Lamb | H01L 31/02168 136/255 |
| 5,019,177 | A | 5/1991 | Wanlass | |
| 5,021,360 | A | 6/1991 | Melman et al. | |
| 5,045,502 | A * | 9/1991 | Lau | H01L 21/28575 257/745 |
| 5,053,083 | A | 10/1991 | Sinton | |
| 5,100,835 | A * | 3/1992 | Zheng | H01L 21/28575 148/DIG. 20 |
| 5,182,420 | A | 1/1993 | Steitz et al. | |
| 5,217,539 | A | 6/1993 | Fraas et al. | |
| 5,246,506 | A | 9/1993 | Arya et al. | |
| 5,275,971 | A * | 1/1994 | Wu | H01L 21/28575 148/DIG. 20 |
| 5,322,572 | A | 6/1994 | Wanlass | |
| 5,342,453 | A | 8/1994 | Olson | |
| 5,376,185 | A | 12/1994 | Wanlass | |
| 5,430,327 | A * | 7/1995 | Wu | H01L 21/28575 257/200 |
| 5,479,032 | A | 12/1995 | Forrest et al. | |
| 5,510,272 | A | 4/1996 | Morikawa et al. | |
| 5,563,422 | A | 10/1996 | Nakamura et al. | |
| 5,944,913 | A | 8/1999 | Hou et al. | |
| 5,980,785 | A * | 11/1999 | Xi | C08K 3/0008 252/500 |
| 6,037,088 | A * | 3/2000 | Morikawa | H01L 31/022458 136/256 |
| 6,057,219 | A * | 5/2000 | Cho | H01L 21/28575 257/E21.172 |
| 6,103,614 | A * | 8/2000 | Ahmari | H01L 21/28575 257/E21.172 |
| 6,165,873 | A | 12/2000 | Hamada | |
| 6,180,432 | B1 | 1/2001 | Freeouf | |
| 6,239,354 | B1 | 5/2001 | Wanlass | |
| 6,242,761 | B1 | 6/2001 | Fujimoto et al. | |
| 6,252,287 | B1 | 6/2001 | Kurtz et al. | |
| 6,281,426 | B1 | 8/2001 | Olson et al. | |
| 6,300,557 | B1 | 10/2001 | Wanlass | |
| 6,300,558 | B1 | 10/2001 | Takamoto et al. | |
| 6,340,788 | B1 | 1/2002 | King et al. | |
| 6,482,672 | B1 | 11/2002 | Hoffman et al. | |
| 6,653,215 | B1 | 11/2003 | Brown et al. | |
| 6,660,928 | B1 | 12/2003 | Patton et al. | |
| 6,690,041 | B2 | 2/2004 | Armstrong et al. | |
| 6,951,819 | B2 | 10/2005 | Iles et al. | |
| 7,071,407 | B2 | 7/2006 | Faterni et al. | |
| 7,122,733 | B2 * | 10/2006 | Narayanan | H01L 31/03046 136/249 |
| 7,166,520 | B1 | 1/2007 | Henley | |
| 7,341,882 | B2 | 3/2008 | Wu | |
| 7,727,795 | B2 | 6/2010 | Stan et al. | |
| 7,741,146 | B2 | 6/2010 | Cornfeld et al. | |
| 7,785,989 | B2 | 8/2010 | Sharps et al. | |
| 7,842,881 | B2 | 11/2010 | Cornfeld et al. | |
| 7,998,863 | B2 * | 8/2011 | Wenham | H01L 21/743 257/E21.249 |
| 8,187,907 | B1 | 5/2012 | Newman | |
| 8,304,272 | B2 * | 11/2012 | Assefa | H01L 31/1085 438/479 |
| 8,753,918 | B2 | 6/2014 | Varghese et al. | |
| 8,987,042 | B2 | 3/2015 | Varghese et al. | |
| 9,018,521 | B1 | 4/2015 | Cornfeld | |
| 2002/0117675 | A1 | 8/2002 | Mascarenhas | |
| 2003/0226952 | A1 | 12/2003 | Clark | |
| 2004/0079408 | A1 | 4/2004 | Fetzer et al. | |
| 2004/0149331 | A1 * | 8/2004 | Sharps | H01L 31/03046 136/255 |
| 2004/0149996 | A1 * | 8/2004 | Hsieh | H01L 33/0079 257/88 |
| 2004/0166681 | A1 | 8/2004 | Iles et al. | |
| 2004/0200523 | A1 | 10/2004 | King et al. | |
| 2005/0117194 | A1 * | 6/2005 | Kim | B82Y 20/00 359/273 |
| 2005/0211291 | A1 | 9/2005 | Bianchi | |
| 2005/0263183 | A1 * | 12/2005 | Nishikitani | B82Y 10/00 136/263 |
| 2005/0274409 | A1 * | 12/2005 | Fetzer | H01L 31/0687 136/249 |
| 2005/0274411 | A1 | 12/2005 | King et al. | |
| 2006/0021565 | A1 | 2/2006 | Zahler et al. | |
| 2006/0112986 | A1 * | 6/2006 | Atwater | H01L 31/0687 136/255 |
| 2006/0144435 | A1 * | 7/2006 | Wanlass | H01L 31/06875 136/249 |
| 2006/0162768 | A1 | 7/2006 | Wanlass et al. | |
| 2006/0185582 | A1 | 8/2006 | Atwater, Jr. et al. | |
| 2006/0207651 | A1 * | 9/2006 | Posthuma | H01L 31/022425 136/261 |
| 2006/0219167 | A1 * | 10/2006 | Cheng | H01L 21/324 118/715 |
| 2007/0057339 | A1 * | 3/2007 | Mitsui | H01L 27/14647 257/432 |
| 2007/0137694 | A1 | 6/2007 | Foster et al. | |
| 2007/0218649 | A1 | 9/2007 | Hernandez | |
| 2007/0277873 | A1 | 12/2007 | Cornfeld et al. | |
| 2008/0029151 | A1 | 2/2008 | McGlynn et al. | |
| 2008/0149173 | A1 | 6/2008 | Sharps | |
| 2008/0185038 | A1 | 8/2008 | Sharps | |
| 2008/0245409 | A1 * | 10/2008 | Varghese | H01L 31/06875 136/256 |
| 2009/0038679 | A1 * | 2/2009 | Varghese | H01L 31/02243 136/256 |
| 2009/0078308 | A1 | 3/2009 | Varghese et al. | |
| 2009/0078309 | A1 | 3/2009 | Cornfeld et al. | |
| 2009/0078310 | A1 | 3/2009 | Stan et al. | |
| 2009/0078311 | A1 | 3/2009 | Stan et al. | |
| 2009/0155952 | A1 | 6/2009 | Stan et al. | |
| 2009/0188546 | A1 | 7/2009 | McGlynn et al. | |
| 2009/0223554 | A1 | 9/2009 | Sharps | |
| 2009/0229658 | A1 | 9/2009 | Stan et al. | |
| 2009/0229662 | A1 | 9/2009 | Stan et al. | |
| 2009/0272430 | A1 | 11/2009 | Cornfeld et al. | |
| 2009/0272438 | A1 | 11/2009 | Cornfeld | |
| 2009/0288703 | A1 | 11/2009 | Stan et al. | |

(56) References Cited

U.S. PATENT DOCUMENTS

| | | | |
|---|---|---|---|
| 2009/0314348 A1 | 12/2009 | McGlynn et al. | |
| 2010/0012174 A1 | 1/2010 | Varghese et al. | |
| 2010/0012175 A1* | 1/2010 | Varghese | H01L 31/022425 136/255 |
| 2010/0029035 A1* | 2/2010 | Chin | H01L 31/022425 438/72 |
| 2010/0031994 A1 | 2/2010 | Varghese | |
| 2010/0047959 A1 | 2/2010 | Cornfeld et al. | |
| 2010/0089435 A1* | 4/2010 | Lockenhoff | H01L 31/048 136/246 |
| 2010/0093127 A1 | 4/2010 | Sharps et al. | |
| 2010/0103406 A1* | 4/2010 | Zimmermann | G01C 3/08 356/4.01 |
| 2010/0116327 A1 | 5/2010 | Cornfeld | |
| 2010/0122724 A1 | 5/2010 | Cornfeld et al. | |
| 2010/0122764 A1 | 5/2010 | Newman | |
| 2010/0126572 A1* | 5/2010 | Kizilyalli | H01L 31/0304 136/255 |
| 2010/0147366 A1 | 6/2010 | Stan et al. | |
| 2010/0186804 A1 | 7/2010 | Cornfeld | |
| 2010/0203730 A1 | 8/2010 | Cornfeld et al. | |
| 2010/0206365 A1 | 8/2010 | Chumney et al. | |
| 2010/0229913 A1 | 9/2010 | Cornfeld | |
| 2010/0229926 A1 | 9/2010 | Newman et al. | |
| 2010/0229932 A1 | 9/2010 | Cornfeld et al. | |
| 2010/0229933 A1 | 9/2010 | Cornfeld | |
| 2010/0233838 A1 | 9/2010 | Varghese | |
| 2010/0233839 A1 | 9/2010 | Cornfeld et al. | |
| 2010/0236615 A1 | 9/2010 | Sharps | |
| 2010/0248411 A1 | 9/2010 | Cornfeld et al. | |
| 2010/0282288 A1 | 11/2010 | Cornfeld | |
| 2010/0283153 A1* | 11/2010 | Wu | H01L 24/02 257/745 |
| 2011/0030774 A1 | 2/2011 | Cornfeld et al. | |
| 2011/0041898 A1 | 2/2011 | Cornfeld | |
| 2011/0048532 A1* | 3/2011 | Kizilyalli | H01L 31/0236 136/256 |
| 2011/0056553 A1* | 3/2011 | Kizilyalli | H01L 31/0236 136/256 |
| 2012/0103406 A1* | 5/2012 | Kayes | H01L 31/022425 136/256 |
| 2012/0199188 A1* | 8/2012 | Nie | H01L 31/022425 136/256 |
| 2012/0273823 A1 | 11/2012 | Yoneda et al. | |
| 2013/0034931 A1* | 2/2013 | Varghese | H01L 31/022425 438/87 |

FOREIGN PATENT DOCUMENTS

| | | |
|---|---|---|
| EP | 1 863 099 | 12/2007 |
| EP | 0 658 944 | 4/2009 |
| FR | 2 878 076 A1 | 5/2006 |
| JP | H06-37036 | 2/1994 |
| JP | H08-274372 | 10/1996 |
| JP | H10-256645 | 9/1998 |
| JP | 2010-263029 | 11/2010 |
| JP | 2012-99806 | 5/2012 |
| WO | WO 2005/015638 A1 | 2/2005 |

OTHER PUBLICATIONS

U.S. Appl. No. 12/708,361, filed Feb. 18, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/813,408, filed Jun. 10, 2010, Patel.
U.S. Appl. No. 12/844,673, filed Jul. 27, 2010, Stan.
Advisory Action mailed Mar. 15, 2011 for U.S. Appl. No. 11/445,793.
Aiken et al., "Consideration of High Bandgap Subcells for Advanced Multijunction Solar Cells," *Conference Record of the 2006 IEEE 4th World Conference on Photovoltaic Energy Conversion*, 2006; pp. 838-841.
Aina et al., "Low-temperature sintered AuGe/GaAs ohmic contact," *J. Appl. Phys.*, 1982; 53(1):777-780.
Amendment A for U.S. Appl. No. 09/971,965 dated Mar. 12, 2003; 7 pgs.
Baca et al., "A survey of ohmic contacts to III-V compound semiconductors," *Thin Solid Films*, 1997; 308-309:599-606.
Böer, "Table A.17: Photoelectrically Determined Workfunction of Metals in eV (Preferred Values (after Michaelson, 1977)," *Survey of Semiconductor Physics*, vol. II, New York, NY, 1992, Cover page, title page, and p. 1323.
Cornfeld et al., "Development of a Large Area Inverted Metamorphic Multi-Junction (IMM) Highly Efficient AM0 Solar Cell," 33rd *Photovoltaic Specialists Conference*, May 11-16, 2008, San Diego, CA, USA; 5 pgs.
Cornfeld et al., "Development of a Large Area Inverted Metamorphic Multi-Junction Highly Efficient AM0 Solar Cell," Conference paper presented at the 33rd Photovoltaic Specialists Conference (May 11-16, 2008) on May 12, 2008, San Diego, CA, USA; 17 pgs.
Cornfeld et al., "Advances in the Performance of Inverted Metamorphic Multi-junction Solar Cells," 23rd *European Photovoltaic Energy Conference*, Sep. 1-5, 2008, Valencia, Spain; 11 pgs.
Cotal et al., "III-V multijunction solar cells for concentrating photovoltaics," *Energy & Environmental Science*, 2009; 2:174-192.
Declaration of Matthew A. Smith, U.S. Pat. No. 6,653,215 dated Sep. 16, 2012; 3 pgs.
Durbha et al., "Thermal Stability of Ohmic Contacts to n-In$_x$Ga$_{1-x}$N," *Mat. Res. Soc. Symp. Proc.*, 1996; 395:825-830.
Duxstad, *Metal Contacts on ZnSe and GaN, Ph.D. Thesis*, May 1997, Ernest Orlando Lawrence Berkeley National Laboratory, 190 pgs.
Foresi et al., "Metal contacts to gallium nitride," *Appl. Phys. Lett.*, May 1993; 62(22):2859-2861.
Friedman et al., "0.7-eV GaInAs Junction for a GaInP/GaAs/GaInAs(1eV)/GaInAs(0.7eV) Four-Junction Solar Cell," 2006 *IEEE 4th World Conference on Photovoltaic Energy Conversion*, May 7-12, 2006, Waikoloa, Hawaii, USA; pp. 598-602.
Geisz et al., "High-efficiency GaInP/GaAs/InGaAs triple-junction solar cells grown inverted with a metamorphic bottom junction," *Applied Physics Letters*, 2007; 91(023502):023502-1-023502-3. Online publication Jul. 10, 2007.
Geisz et al., "Inverted GaInP / (In)GaAs / InGaAs Triple-Junction Solar Cells with Low-Stress Metamorphic Bottom Junctions," 33rd *Photovoltaic Specialists Conference*, May 11-16, 2008, San Diego, CA, USA.
Haynes, Ed., "Electron Work Function of the Elements," *CRC Handbook of Chemistry and Physics, 93rd Edition*, Internet Version 2013, Boca Raton, FL 2013, p. 12-124.
Hoff et al., "Ohmic contacts to semiconducting diamond using a Ti/Pt/Au trilayer metallization scheme," *Diamond and Related Materials*, 1996; 5:1450-1456.
Ivey, "Platinum Metals in Ohmic Contacts to III-V Semiconductors," *Platinum Metals Rev.*, 1999; 43(1):2-12.
King et al., "Next-Generation, High Efficiency III-V Multijunction Solar Cells," 28th *IEEE Photovoltaic Specialists Conference*, Sep. 15-22, 2000, Anchorage, AK, USA.
King et al., "High-Efficiency Space and Terrestrial Multijunction Solar Cells Through Bandgap Control in Cell Structures," 2002 *Photovoltaic Specialists Conference, Conference Record of the 29th IEEE*, May 19-24, 2002, New Orleans, LA, USA; pp. 776-781.
Lepselter, "Beam-Lead Technology," *The Bell System Technical Journal*, Feb. 1966, XLV(2):233-253.
Lewis et al., "The Crystallographic Connection of MOCVD-Grown Monolithic Cascade Subcells Via Transparent Graded Layers," *Journal of Crystal Growth*, 1984; 69:515-526.
Lewis et al., "Recent Developments in Multijunction Solar Cell Research," *Solar Cells*, 1988; 24:171-183.
Liu et al., "A Review of the Metal-GaN Contact Technology," *Solid-State Electronics*, 1998; 42(5):677-691.
Luther et al., "Investigation of the mechanism for Ohmic contact formation in Al and Ti/Al contacts to n-type GaN," *Appl. Phys. Lett.*, Jan. 1997; 70(2):57-59.
Marshall et al., "Nonalloyed ohmic contacts to n-GaAs by solid-phase epitaxy of Ge," *J. Appl. Phys.*, Aug. 1987; 62(3):942-947.

(56) References Cited

OTHER PUBLICATIONS

Memorandum Opinion and Order, United States District Court Eastern District of Texas Marshall Division, *Agere Systems, Inc.* vs. *Sony Corp., et al.*, Case No. 2:06-CV-079; May 15, 2008; 41 pgs.
Michaelson, "Work Functions of the Elements," *Journal of Applied Physics*, Jun. 1950; 21:536-540.
Michaelson et al., "The work function of the elements and its periodicity," *Journal of Applied Physics*, Nov. 1977; 48(11):4729-4733.
Murarka et al., "Investigation of the Ti-Pt Diffusion Barrier for Gold Beam Leads on Aluminum," *J. Electrochem. Soc.*, 1978; 125(1):156-162.
National Semiconductor Corporation, "Packaging: General Packaging Information," datasheet [online]. National Semiconductor Corporation, Santa Clara, CA, Aug. 2000 [retrieved on Aug. 29, 2013]. Retrieved from the Internet:<URL:www.web.archive.org/web/20000817171334/http::/www.national.com/packaging/general.html>; 3 pgs.
National Semiconductor Corporation, "Semiconductor Packaging Assembly Technology," Aug. 1999; 8 pgs.
Notice of Allowance and Fee(s) due for U.S. Appl. No. 09/971,965; 4 pgs.
Office Action mailed Nov. 12, 2002 for U.S. Appl. No. 09/971,965; 9 pgs.
Office Action mailed Nov. 8, 2010 (double patenting rejection) for U.S. Appl. No. 12/047,842.
Office Action mailed Jan. 4, 2011 for U.S. Appl. No. 11/445,793 (Sexl reference, double patenting rejection).
Oswald, "Section 10: Metallurgy, Heat Treating, and Testing," and Krar "Section 13: Plastics," *Illustrated Dictionary of Metalworking and Manufacturing Technology*, Welland, Ontario 1999, Cover page, title page, and pp. 178-179, 215, and 217.
Partial European Search Report for EP 08 01 3466 dated Feb. 12, 2009.
Piotrowska et al., "Ohmic Contacts to III-V Compound Semiconductors: A Review of Fabrication Techniques," *Solid State Electronics*, 1983; 26(3): 179-197.
Reddy et al., "Structural and electrical properties of Mo/n—GaN Schottky diodes," *phys. stat. sol. (a)*, 2006; 203(3):622-627.
Response to the Official Communication for EP 0 622 858 dated Apr. 10, 2002; 13 pgs.
Schroder et al., "Solar Cell Contact Resistance—A Review," IEEE Transactions on Electron Devices, May 1984; ED-31(5):637-647.
Schroder, "Chapter 3: Contact Resistance and Schottky Barrier Height, Section 3.4, Measurement Techniques," *Semiconductor Material and Device Characterization*, 1990, New York, NY; cover page, title page, table of contents, and pp. 109-130.
Schubert et al., "Specific resistance of ohmic contacts," 5 pgs.
Schultz et al., "High Efficiency 1.0-eV GaInAs Bottom Solar Cell for 3-Junction Monolithic Stack," *IEEE*, 1990; pp. 148-152.
Sexl et al., "MBE Growth of Metamorphic In(Ga)AlAs Buffers," *1997 IEEE International Symposium on Compound Semiconductors*, Sep. 1997; pp. 49-52. IEEE Piscataway, NJ.

Sharps et al., "Inverting the triple junction improves efficiency and flexibility," *Compound Semiconductor*, Oct. 2007; pp. 25-28.
Sinharoy et al., "Progress in the Development of Metamorphic Multi junction III-V Space Solar Cells," *Progress in Photovoltaics: Research and Applications*, Feb. 2002; 10:427-432.
Stan et al., "Recent Advances in the Performance of Multi-Junction Space Solar Cells," 22nd European Photovoltaic Solar Energy Conference, Sep. 3-7, 2007, Milan, Italy; pp. 101-105.
Stan et al., "Very High Efficiency Triple Junction Solar Cells by MOVPE," 14th *International Conference of Metalorganic Vapor Phase Epitaxy*, Jun. 1-6, 2008, Metz, France; 32 pgs.
Stan et al., "High-efficiency quadruple junction solar cells using OMVPE with inverted metamorphic device structures," *Journal of Crystal Growth*, 2010; 312:1370-1374.
Sze, "Schottky Effect," *Physics of Semiconductor Devices, Second Edition*, New York, NY 1981; cover page, title page, and pp. 251 and 308.
Takamoto et al., "Future Development of InGaP/(In)GaAs Based Multijunction Solar Cells," *Proceedings of the 31st IEEE PVSC*, Jan. 3-7, 2005, Lake Buena Vista, FL; pp. 519-524.
Takamoto et al., "InGaP/GaAs-based Multijunction Solar Cells," *Progress in Photovoltaics: Research and Applications*, 2005; 13:495-511.
Terry et al., "Metallization Systems for Silicon Integrated Circuits," *Proceedings of the IEEE*, Sep. 1969; 57(9):1580-1586.
Translation Certificate dated May 14, 2013 and English translation of Laid-Open Patent Application Publication No. H10-256645 dated Sep. 25, 1998, paragraphs 0031 through 0033; 2 pgs.
Vandenberg et al., "An in situ x-ray study of gold/barrier-metal interactions with InGaAsP/InP layers," *J. Appl. Phys.*, May 15, 1984; 55(1):3676-3681.
Venkatasubramanian et al., "An Inverted-Growth Approach to Development of an IR-Transparent, High-Efficiency AlGaAs/GaAs Cascade Solar Cell," 22nd *IEEE Photovoltaic Specialists Conference*, Oct. 7-11, 1991, Las Vegas, NV, USA.
Venkatasubramanian et al., "High-quality eutectic-metal-bonded AlGaAs-GaAs thin films on Si substrates," *Applied Physics Letters*, Feb. 17, 1992; 60(7):886-888.
Wanlass et al., "Lattice-Mismatched Approaches for High-Performance, III-V Photovoltaic Energy Converters," *Proceedings of the 31st IEEE PVSC*, Jan. 3-7, 2005, Lake Buena Vista, FL, USA.
Wanlass et al., "Monolithic, Ultra-Thin GaInP/FaAs/FaInAs Tandem Solar Cells," 2006 *IEEE 4th World Conference on Photovoltaic Energy Conversion*, May 7-12, 2006, Waikoloa, Hawaii, USA.
Wurfel, P., ed., *Physics of Solar Cells: from Basic Principles to Advanced Concepts*, 2nd, Updated and Expanded Edition, Wiley-VCH, Weinheim, Germany, 2009; Sections 6.4, 6.5 and 6.8; 20 pgs.
Yamaguchi, "Physics and Technologies of Superhigh-Efficiency Tandem Solar Cells," *Semiconductors*, Sep. 1999; 33(9):961-964. Toyota Technological Institute, Nagoya, Japan. © 999, American Institute of Physics.
Yoon et al., "Progress of Inverted Metamorphic III-V Solar Cell Development at Spectrolab," 33rd *IEEE Photovoltaic Specialists Conference*, May 11-16, 2008, San Diego, CA, USA.

* cited by examiner

OHMIC N-CONTACT FORMED AT LOW TEMPERATURE IN INVERTED METAMORPHIC MULTIJUNCTION SOLAR CELLS This is a continuation of patent application Ser. No. 14/284,909, filed May 22, 2014, which is a continuation of U.S. patent application Ser. No. 13/603,088, filed Sep. 4, 2012, now U.S. Pat. No. 8,753,918, which is a divisional of U.S. patent application Ser. No. 12/218,582, filed Jul. 16, 2008, all of which are herein incorporated by reference in their entireties.

REFERENCE TO RELATED APPLICATIONS

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of semiconductor devices, and to processes requiring the formation of ohmic contacts at relatively low temperatures. More particularly, the invention relates to fabrication processes and devices such as multijunction solar cells based on III-V semiconductor compounds including a metamorphic layer. Such devices are also known as inverted metamorphic multijunction solar cells.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as concentrator terrestrial power systems and satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multijunction structures, and disposed in horizontal arrays, with the individual solar cells connected together in a series. The shape and structure of an array, as well as the number of cells it contains, are determined in part by the desired output voltage and current.

Inverted metamorphic solar cell structures such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important conceptual starting point for the development of future commercial high efficiency solar cells. The structures described in such reference present a number of practical difficulties relating to the appropriate choice of materials and fabrication steps, for a number of different layers of the cell.

Prior to the present invention, the materials and fabrication steps disclosed in the prior art have not been adequate to produce a commercially viable and energy efficient solar cell using commercially established fabrication processes for producing an inverted metamorphic multijunction cell structure.

SUMMARY OF THE INVENTION

Briefly, and in general terms, the present invention provides a method of forming a multijunction solar cell comprising an upper subcell, a middle subcell, and a lower subcell, the method comprising; providing a first substrate for the epitaxial growth of semiconductor material; forming an upper first solar subcell on said first substrate having a first band gap; forming a middle second solar subcell over said first solar subcell having a second band gap smaller than said first band gap; forming a graded interlayer over said second solar cell; forming a lower third solar subcell over said graded interlayer having a fourth band gap smaller than said second band gap such that said third subcell is lattice mismatched with respect to said second subcell; and forming a contact having a contact resistance of less than $2 \times 10^{-4}$ ohms-cm$^2$ over said first subcell at a temperature of 210° C. or less.

In another aspect, the present invention provides a method of manufacturing a solar cell including; providing a first semiconductor substrate for the epitaxial growth of semiconductor material; forming a first subcell on said substrate comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell, said lattice constant transition material having a lattice constant that changes gradually from the first lattice constant to the second lattice constant; and forming a contact at a temperature of 280° C. or less, and having a contact resistance of less than $5 \times 10^{-4}$ ohms-cm$^2$.

In still another aspect, the present invention provides a method of manufacturing a solar cell including; providing a first semiconductor substrate; depositing on a first substrate a sequence of layers of semiconductor material forming a solar cell forming a contact having a resistance of less than $5 \times 10^{-4}$ ohms-cm$^2$; mounting a surrogate second substrate on top of the sequence of layers; and removing the first substrate.

In still another aspect, the present invention provides, more generally, a method of forming a semiconductor device including providing a substrate for the epitaxial growth of semiconductor material; forming first active layer on said substrate; forming a second active layer over said first active layer; and forming an electrical contact having a contact resistance of less than $2 \times 10^{-4}$ ohms-cm$^2$ over at least one of said active layers at a temperature of 210° C. or less.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
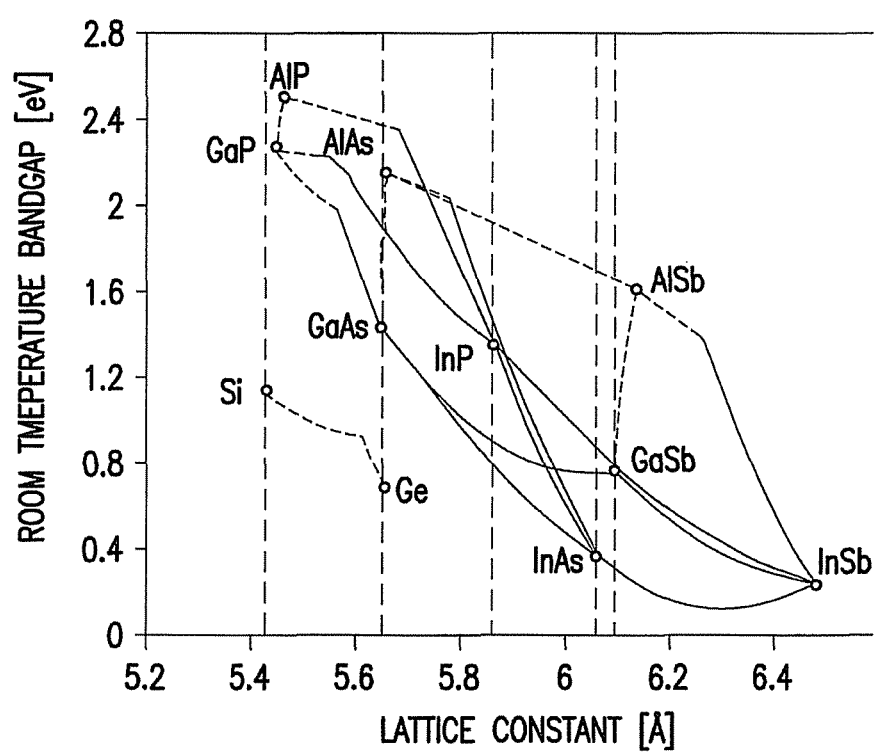
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is provided over the "bottom" or substantially lattice-mismatched lower subcell, and the growth semiconductor substrate is subsequently removed. (The growth substrate may then subsequently be re-used for the growth of a second and subsequent solar cells).

The present invention is directed to the composition of the metal contact used for the grid lines and bus bar on the top (sunward facing) side of the solar cell. As noted above, one aspect of fabrication of an IMM solar cell is the requirement for attachment to a surrogate substrate of support (also called a "handler") during fabrication. Such attachment is typically done by a temporary adhesive.

The commercially available temporary adhesives have a relatively low melting point of around 100° C., and maintain adhesion to somewhat greater than 200° C. These relatively low operating temperatures place critical restrictions on the alloy temperature needed for forming an ohmic metal contact to the semiconductor layers of the cell, especially to an n-type GaAs layer with a Au—Ge eutectic based alloy with eutectic temperature of 361° C. Normal alloying temperature is typically greater than 360° C. The current commercial production triple junction solar cells use a 365° C. temperature to alloy simultaneously a Ti/Au/Ag to both the n and p-contact. From an electric standpoint, these contacts are rather poor, with specific contact resistivity of greater than $1\times10^{-3}$ greater than Ω-cm$^2$.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
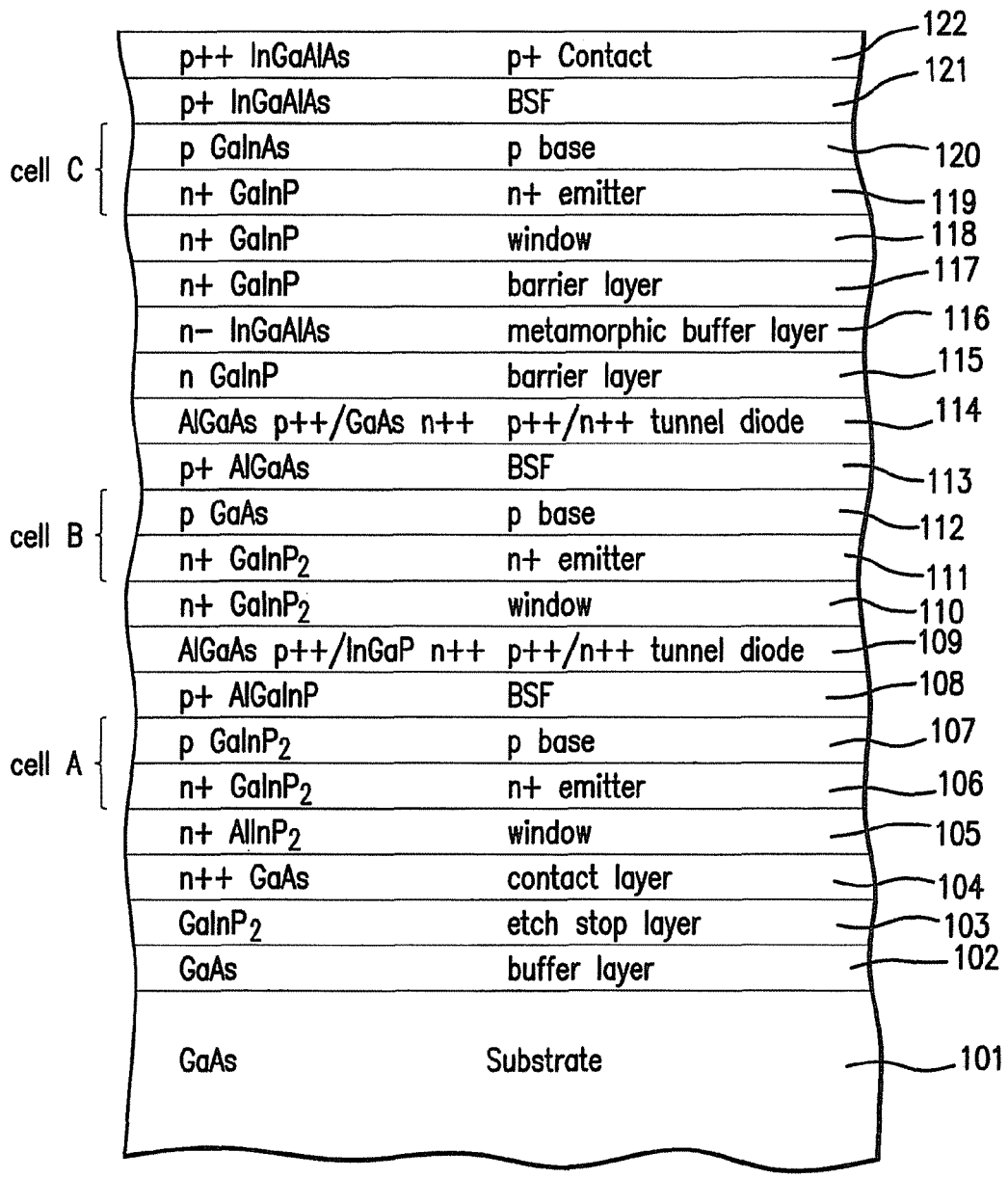
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109 which forms a tunnel diode which is an ohmic circuit element to connect subcell A to subcell B. These layers are preferably composed of p++ AlGaAs, and n++ InGaP.

On top of the tunnel diode layers 109 a window layer 110 is deposited, preferably n+InAlP. The window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and In$_{0.015}$GaAs respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps then the emitters. Therefore, the advantages of using heterojunction subcells are: 1) the short wavelength response for both subcells will improve, and 2) the bulk of the radiation is more effectively absorbed and collected in the narrower band gap base. The effect will be to increase $J_{sc}$.

On top of the cell B is deposited a BSF layer 113 which performs the same function as the BSF layer 109. A p++/n++ tunnel diode 114 is deposited over the BSF layer 113 similar to the layers 109, again forming an ohmic circuit element to connect subcell B to subcell C. These layers 114 are preferably compound of p++ AlGaAs and n++ InGaP.

A barrier layer 115, preferably composed of n-type InGa(Al)P, is deposited over the tunnel diode 114, to a thickness of about 1.0 micron. Such bather layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The bandgap of layer 116 is constant throughout its thickness preferably approximately 1.5 eV or otherwise consistent with a value slightly greater than the bandgap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P of InGaP, or as in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In the preferred embodiment of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGaAlAs metamorphic layer 116. The second bather layer 117 will typically have a different composition than that of bather layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n type InGaAs and p type InGaAs respectively, or n type InGaP and p type InGaAs for a heterojunction subcell, although another suitable materials consistent with lattice constant and bandgap requirements may be used as well. The doping profile of layers 119 and 120 will be discussed in connection with FIG. 16.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
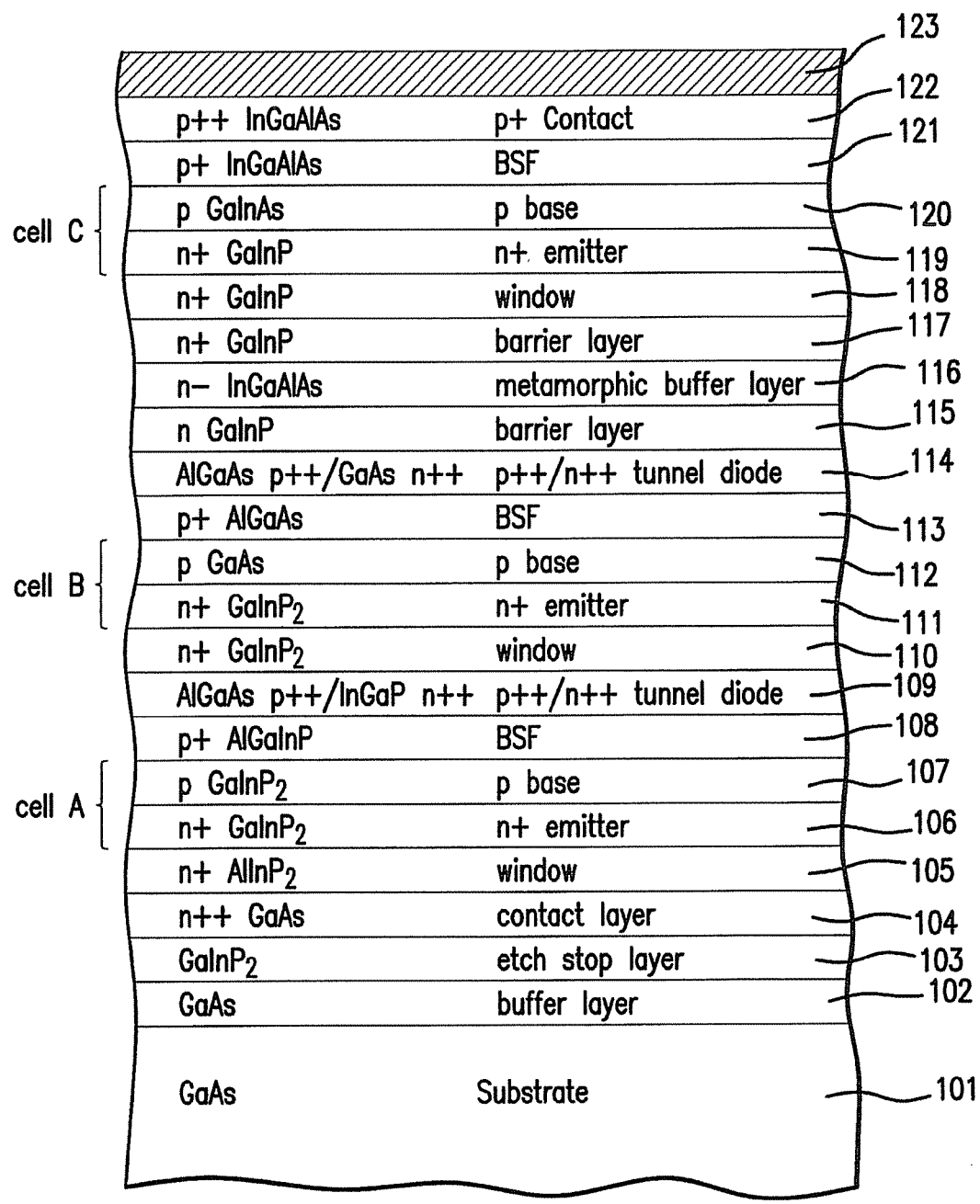
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 4:
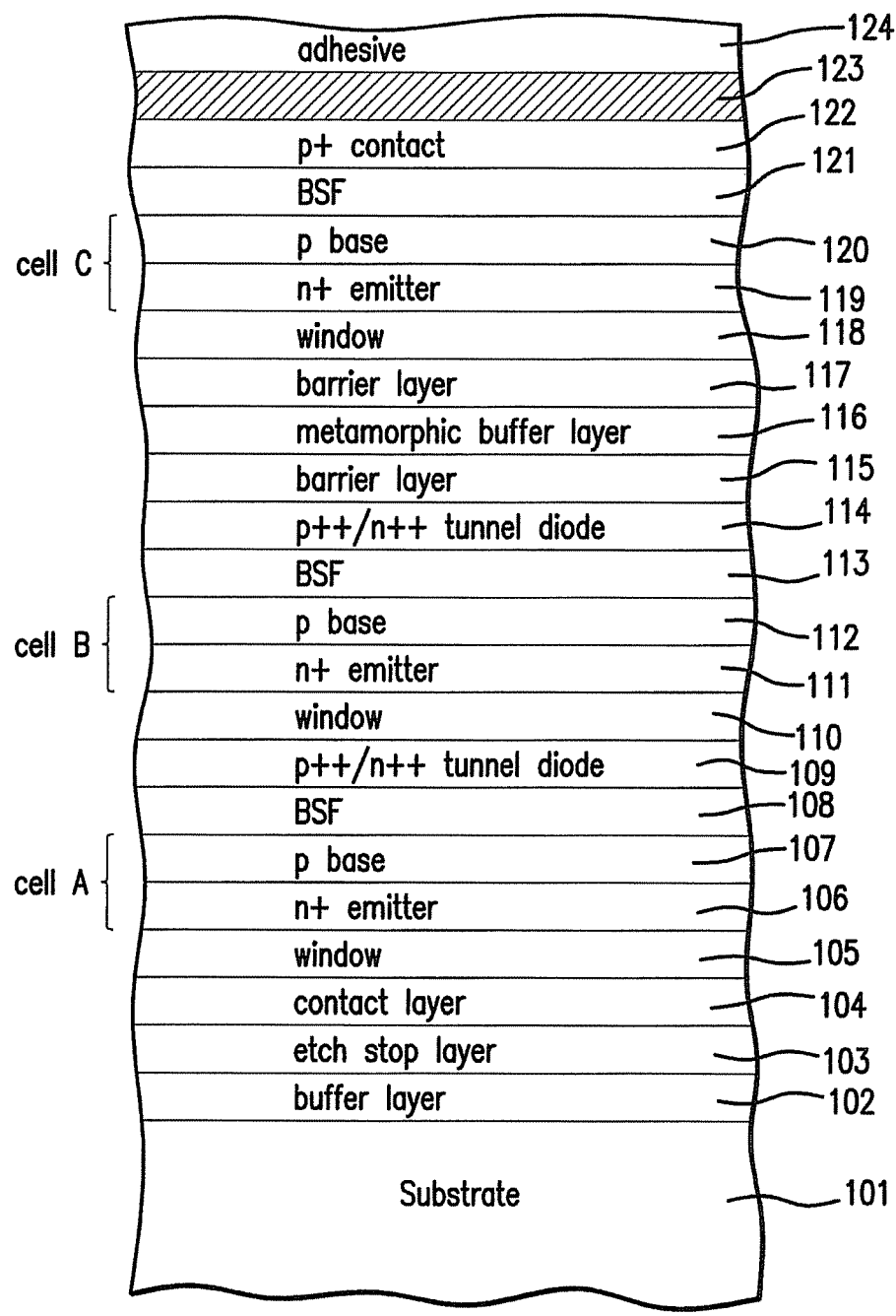
FIG. 4 is a cross-sectional view of the solar cell of FIG. 3 after next process step.

FIG. 4 is a cross-sectional view of the solar cell of FIG. 3 after the next process step in which an adhesive layer 124 is deposited over the metal layer 123. The adhesive is preferably Wafer Bond (manufactured by Brewer Science, Inc. of Rolla, Mo.).

Figure 5A:
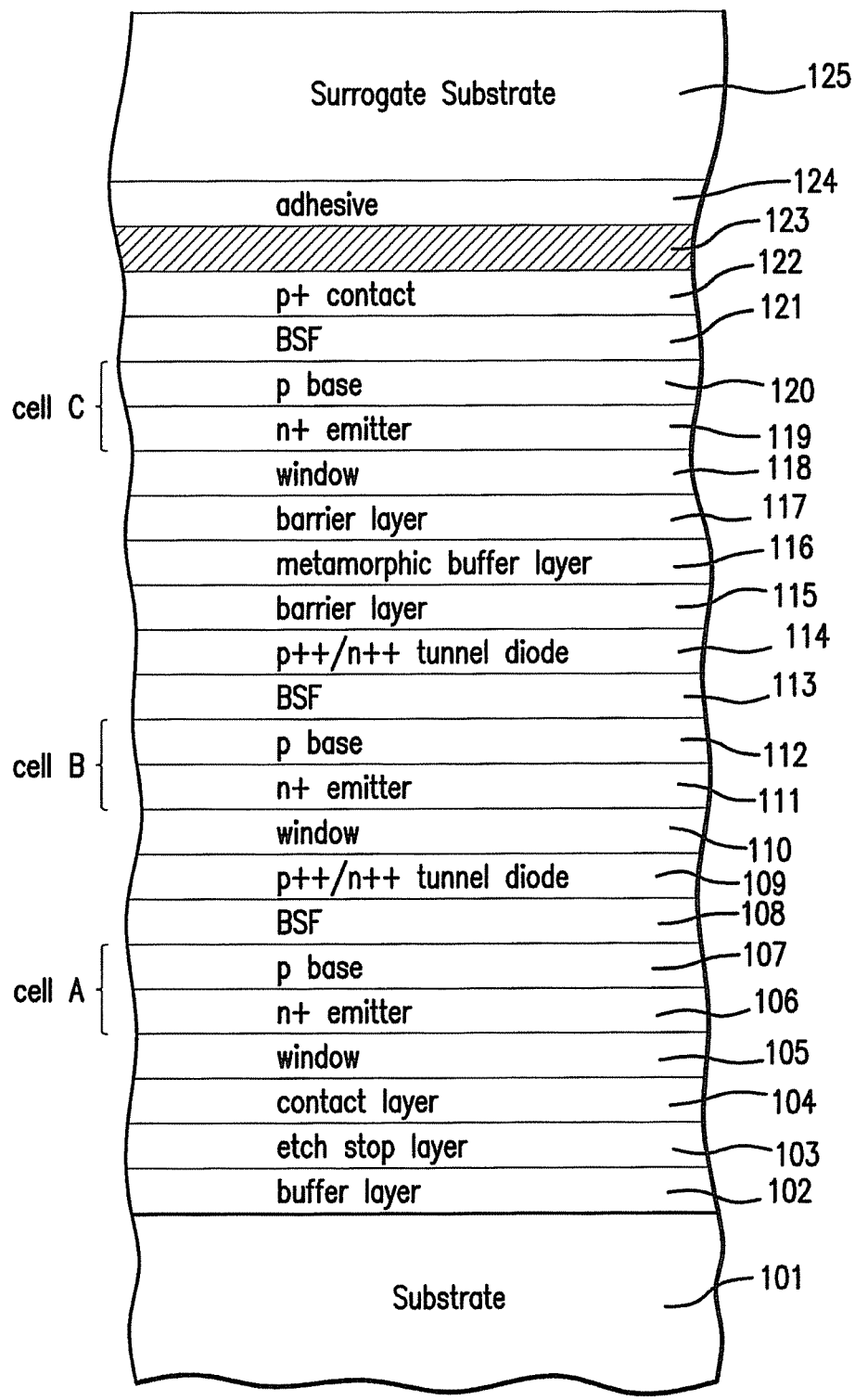
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 124, a suitable substrate (e.g., GaAs) may be permanently bonded to the metal layer 123.

Figure 5B:
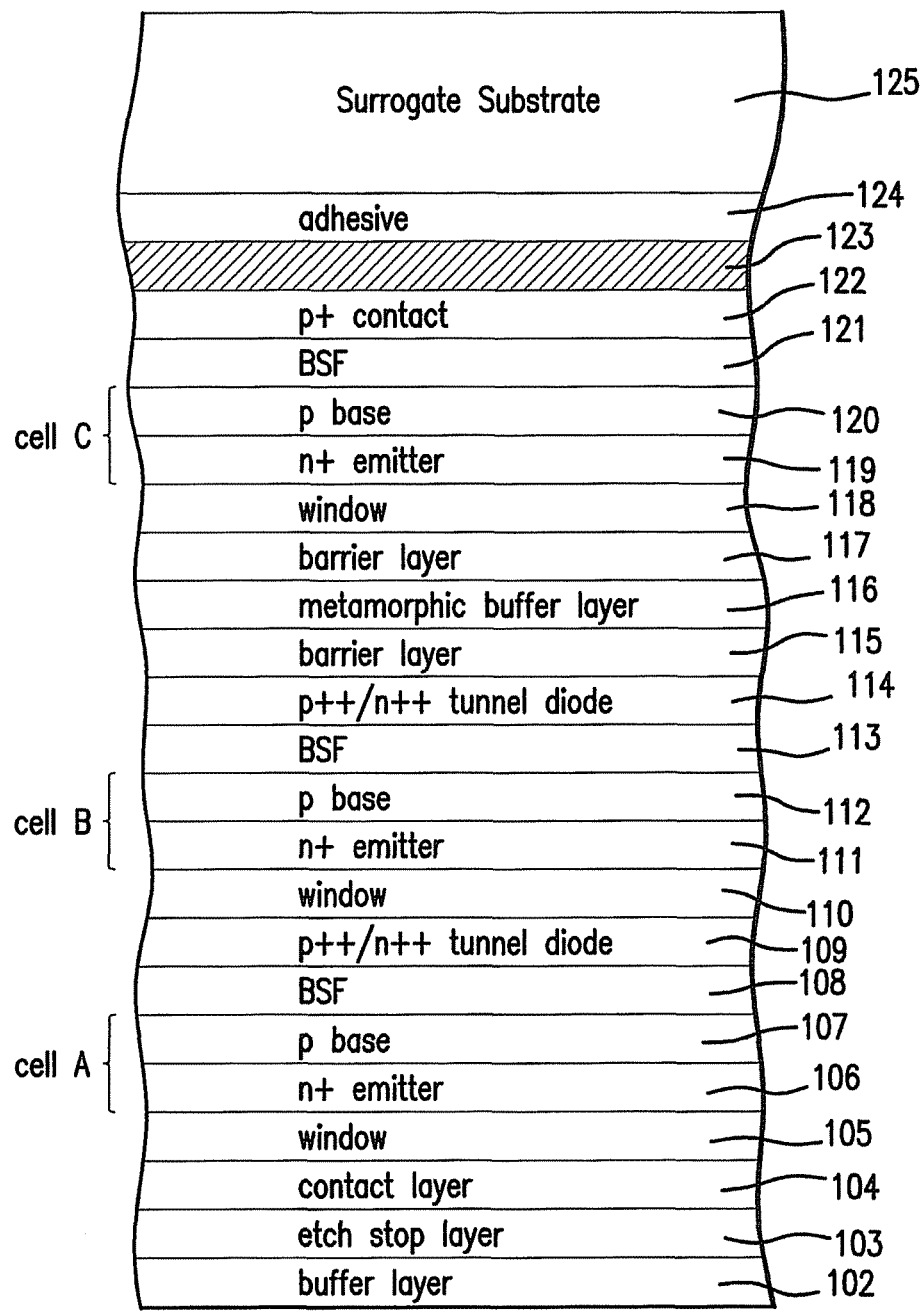
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping and/or etching steps in which the substrate 101, and the buffer layer 103 are removed. The choice of a particular etchant is growth substrate dependent.

Figure 5C:
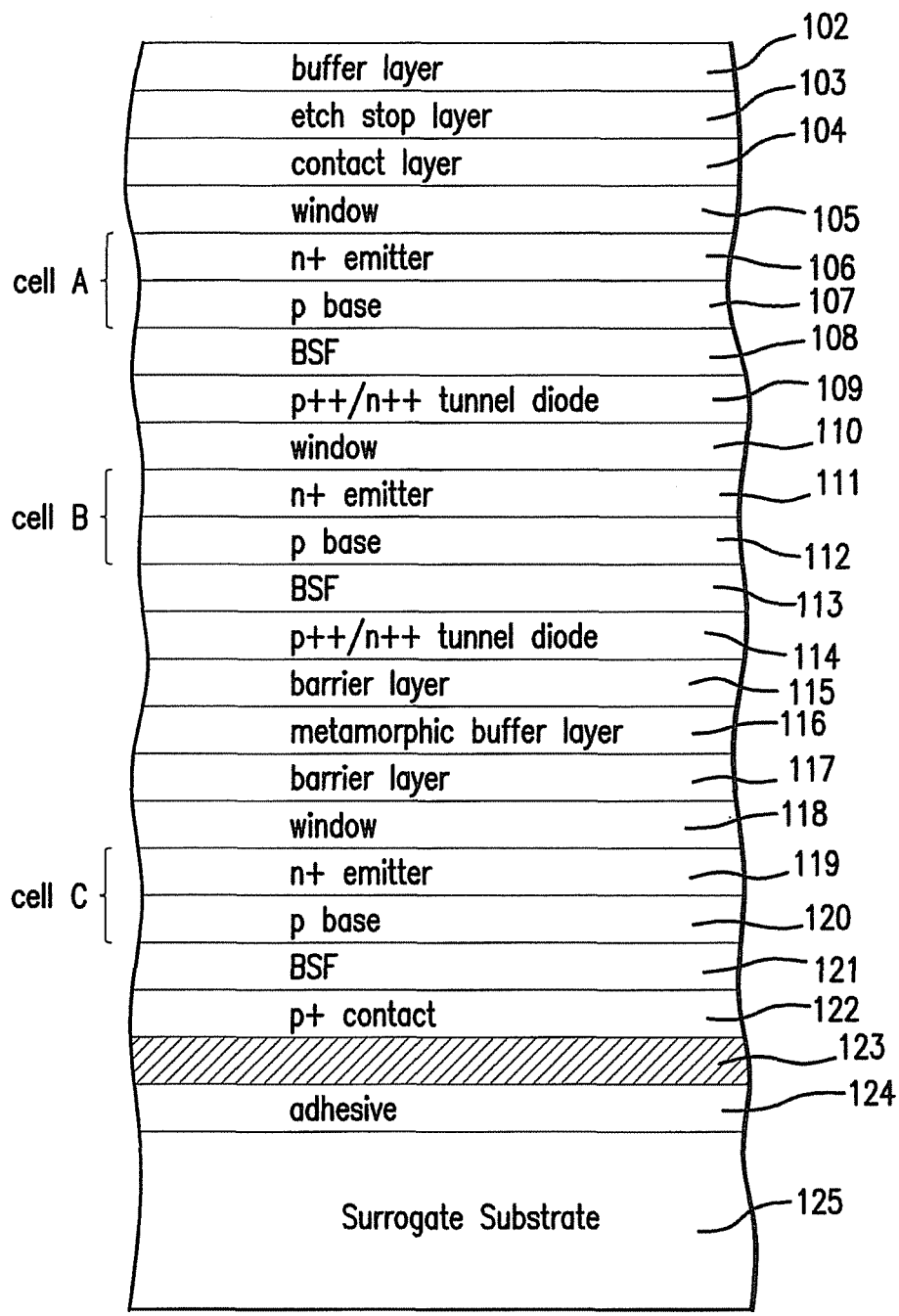
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
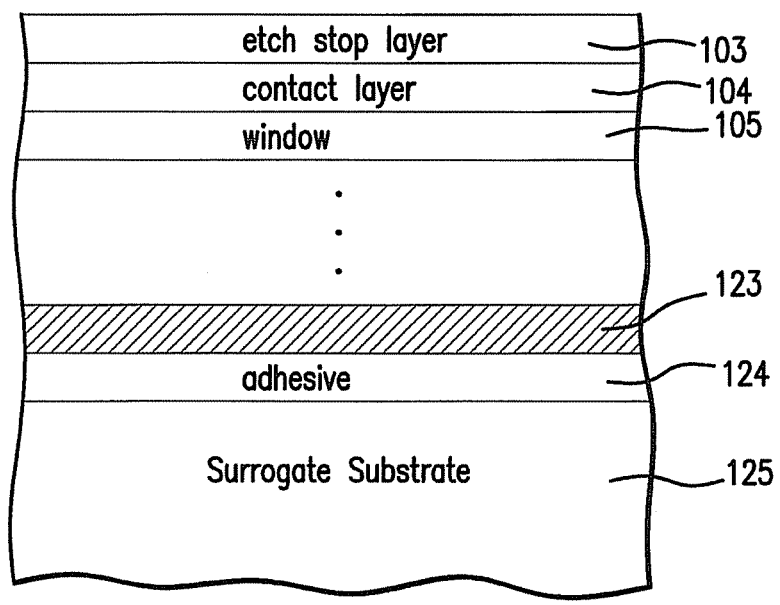
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
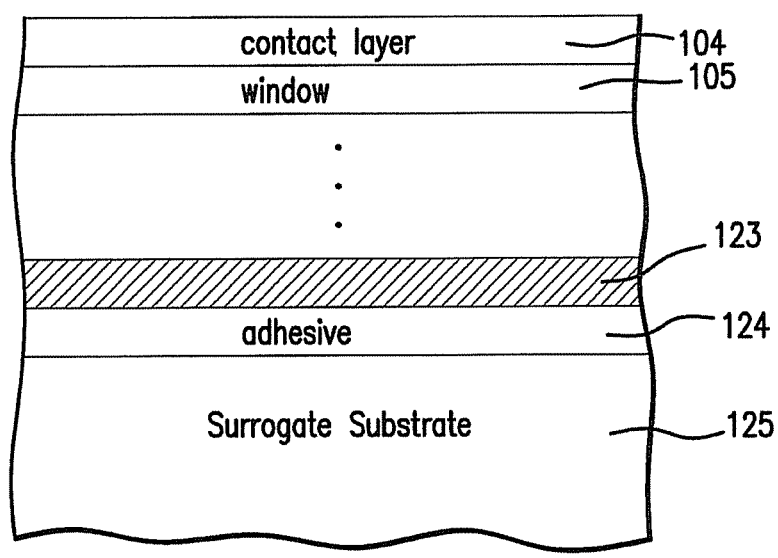
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
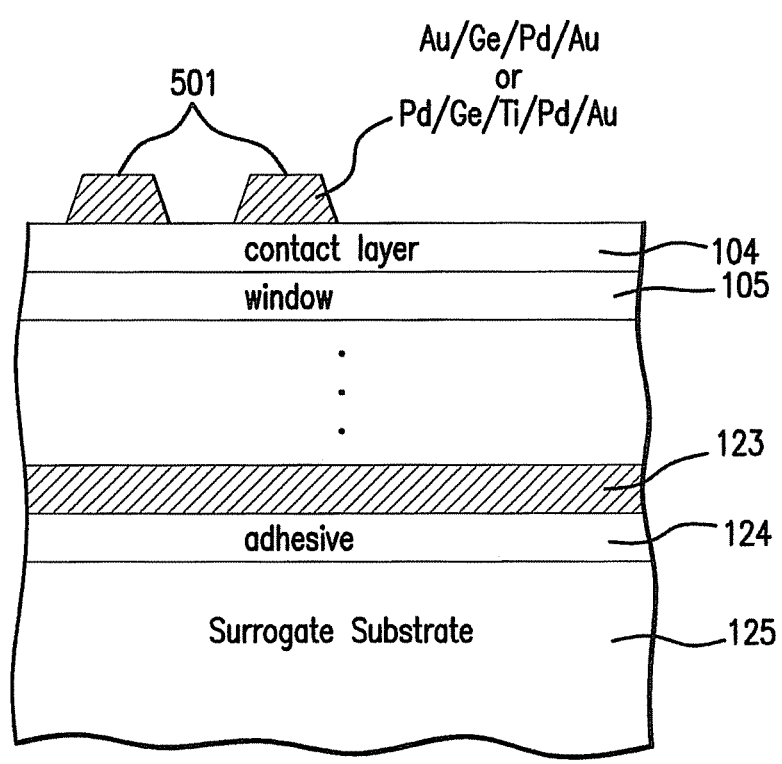
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As noted above, the present invention is directed to the composition of the metal contact. One composition considered was the sequence of layers Au/Ge/Pd/Au, and another was Pd/Ge/Ti/Pd/Au.

Initial investigation of both compositions was done at 280° C. The Au/Ge based contact required a 60 minute anneal (45 minute anneal resulted in a rectifying contact) to give a specific contact resistance of $3\times10^{-6}$ Ω-cm$^2$.

The Pd/Ge based contact sintered for 5 min at 280° C. yielded an acceptable specific contact resistance of nominally $1\times10^{-4}$ Ω-cm$^2$. The more reasonable sintering time for the required specific contact resistance ($\geq 1\times10^{-3}$ Ω-cm$^2$) led to the identification of the Pd/Ge based metallization as optimum for the fabrication process of the solar cell described herein. Moreover, the adhesive thermal property permitted lowering the sinter temperature to 205° C. At this low sinter temperature, a time of 35 minutes was required to achieve a specific contact resistance of $1\times10^{-4}$ Ω-cm$^2$.

A more detailed description of the preferred embodiment is as follows. Prior to the metal deposition of the n-contact, residual oxide is removed from the wafer by soaking the wafer in a solution of 15H$_2$O) 1NH$_4$OH for one minute, and spin dried in N$_2$. The wafer is then loaded in the deposition chamber within 30 minutes to preclude excessive oxide growth. The metallization in the preferred embodiment, i.e. the sequence of layers of 50 nm Pd/100 nm Ge/30 nm Ti/30 nm Pd/5 μm Ag/100 nm Au, is e-beam evaporated during one vacuum cycle. The background chamber pressure at the beginning of deposition is $5\times10^{-7}$ torr. Following deposition, the grid lines 501 and bus bar are defined by liftoff. The contact sintering is then performed in the lab oratory ambient atmosphere on a hot plate. The wafer is placed grid side down on a clean silicon wafer on a hot plate, set at a temperature of 120° C. The wafer and silicon carrier are allowed to equilibrate for 5 min. The hot plate is then set at the sintering temperature (e.g. a set point of 215). Ten minutes are allowed for the wafer to attain the sintering temperature. The metal contact then sinters for 40 min. The hot plate temperature is then dropped in ten minutes to 120° C. The Si carrier and wafer are removed from the hot plate. Transmission line method (TLM) patterns formed on the solar cell wafer permit specific contact resistance measurements, as will be subsequently described in connection with FIG. 17.

A variety of different Pd/Ge based contacts are suitable for application in the present invention, including, but not limited to Pd/Ge/Au, Pd/Ge/Ag, Pd/Ge/Pt/Au, Pd/Ge/Pt/Ag, dried Pd/Ge/Pt/Ag/Au. Those skilled in the art would be able to select the most suitable combination for the semiconductor layers and fabrication processes being utilized.

Two embodiments of the contact composition according to the present invention, viz. Au/Ge/Pd/Au or Pd/Ge/Ti/Pd/Au, are illustrated in FIG. 8. The preferred embodiment is Pd/Ge/Ti/Pd/Au, while other Pd/Ge based layer sequences provide substantially similar results and are within the scope of the present invention.

Figure 9:
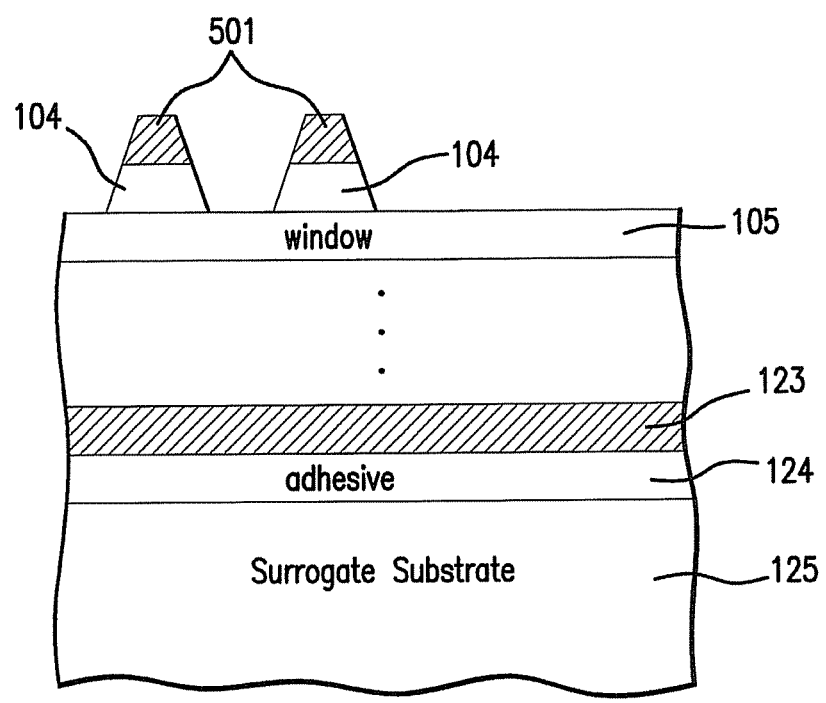
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
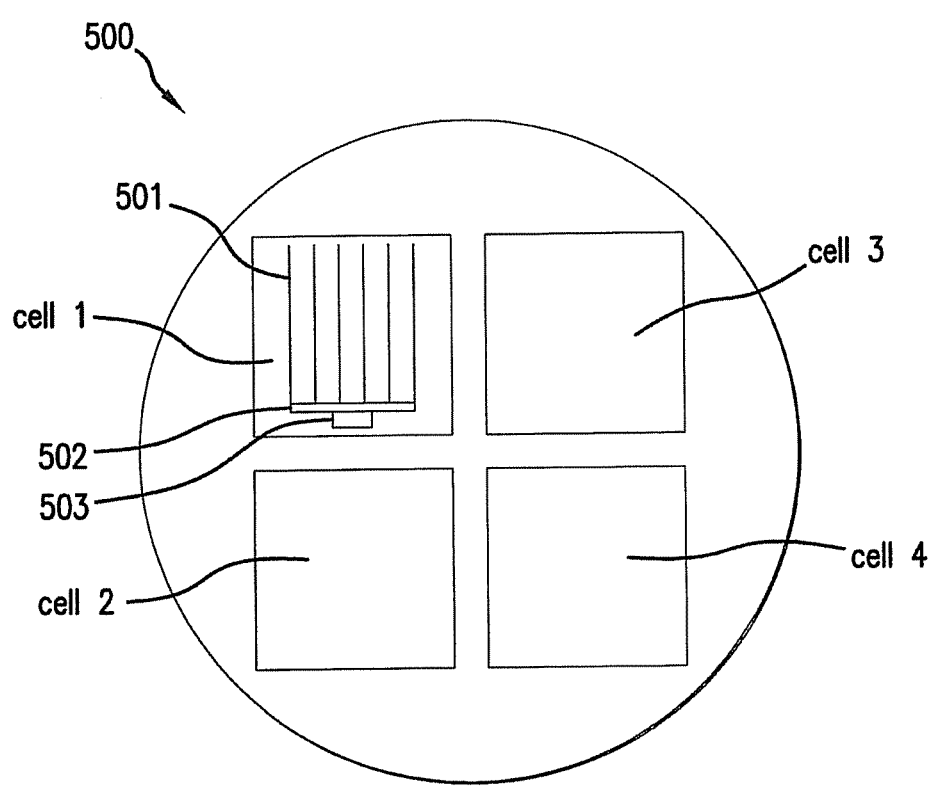
FIG. 10A is a top plan view of a wafer in which the solar cells are fabricated.

FIG. 10A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines is illustrative and the present invention is not limited to the illustrated embodiment.

Figure 10B:
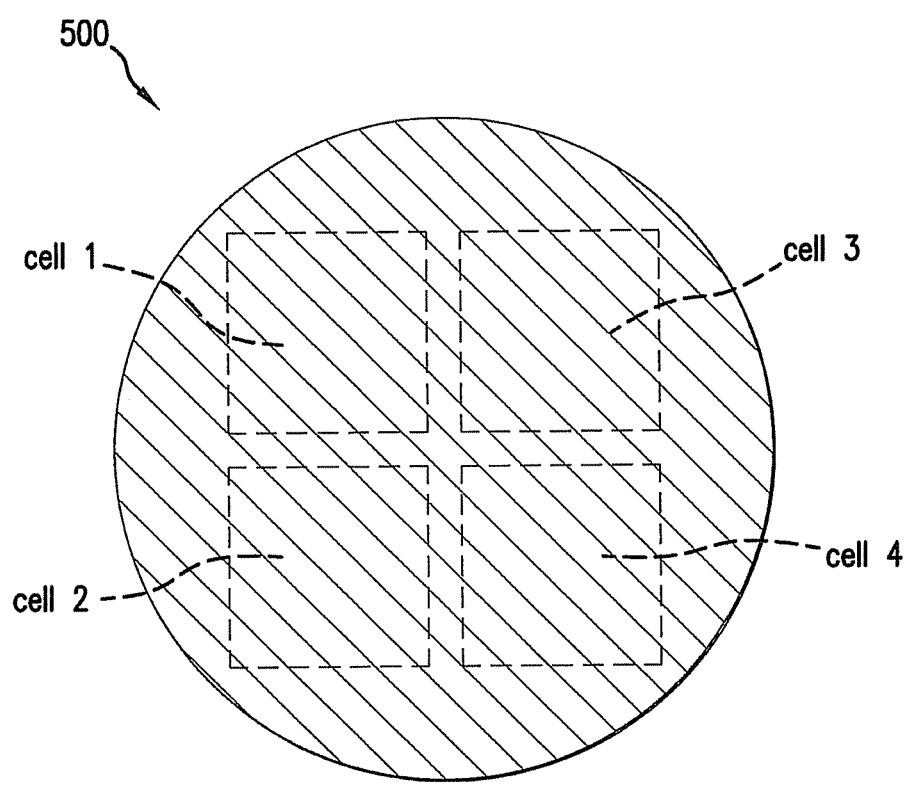
FIG. 10B is a bottom plan view of a wafer in which the solar cells are fabricated.

FIG. 10B is a bottom plan view of the wafer with four solar cells shown in FIG. 10A.

Figure 11:
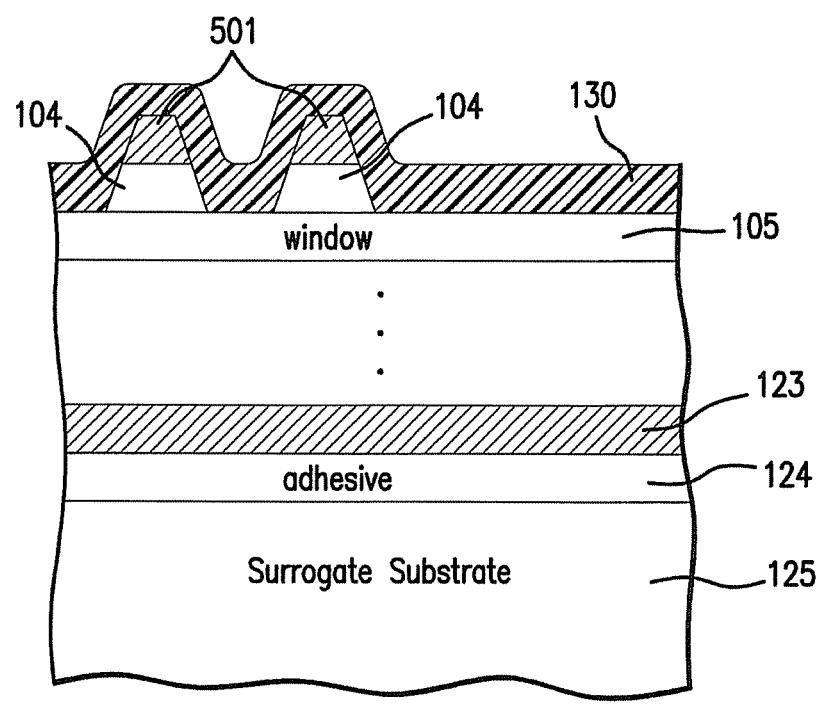
FIG. 11 is a cross-sectional view of the solar cell of FIG. 9 after the next process step.

FIG. 11 is a cross-sectional view of the solar cell of FIG. 11 after the next process step in which an antireflective (ARC) dielectric coating layer 130 is applied over the entire surface of the "bottom" side of the wafer with the grid lines 501.

Figure 12:
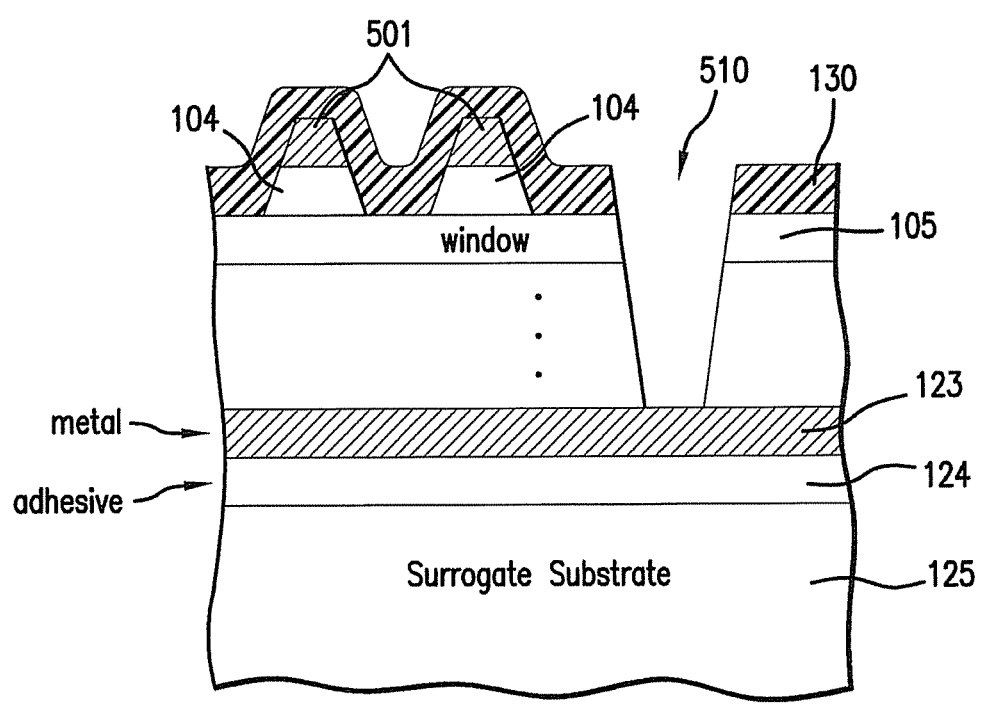
FIG. 12 is a cross-sectional view of the solar cell of FIG. 11 after the next process step.

FIG. 12 is a cross-sectional view of the solar cell of FIG. 11 after the next process step according to the present invention in which a channel 510 or portion of the semiconductor structure is etched down to the metal layer 123 using phosphide and arsenide etchants defining a peripheral boundary and leaving a mesa structure which constitutes the solar cell. The cross-section depicted in FIG. 12 is that as seen from the A-A plane shown in FIG. 13.

Figure 13:
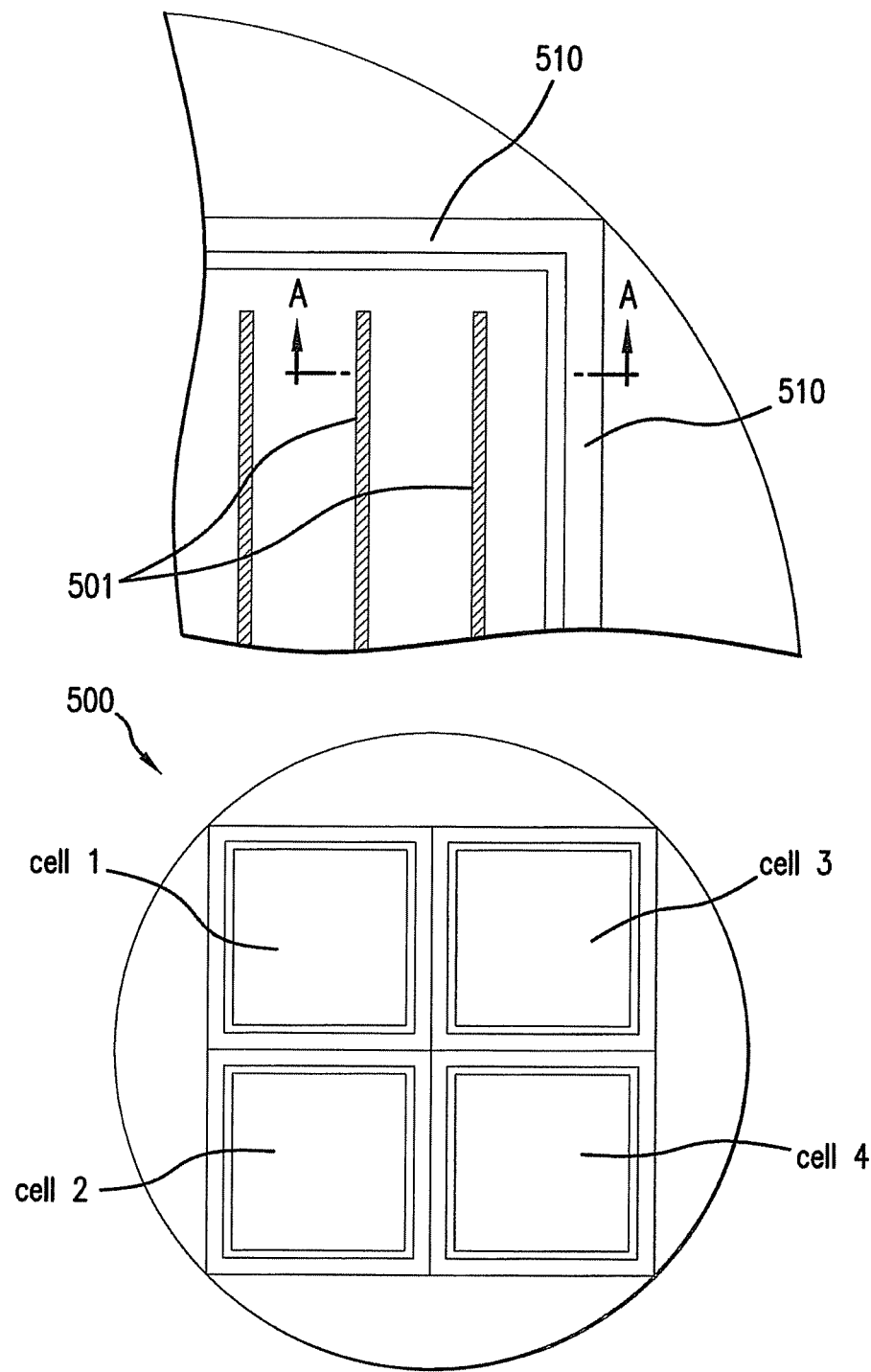
FIG. 13 is a top plan view of the wafer of FIG. 12 depicting the surface view of the trench etched around the cell.

FIG. 13 is a top plan view of the wafer of FIG. 12 depicting the channel 510 etched around the periphery of each cell using phosphide and arsenide etchants.

Figure 14A:
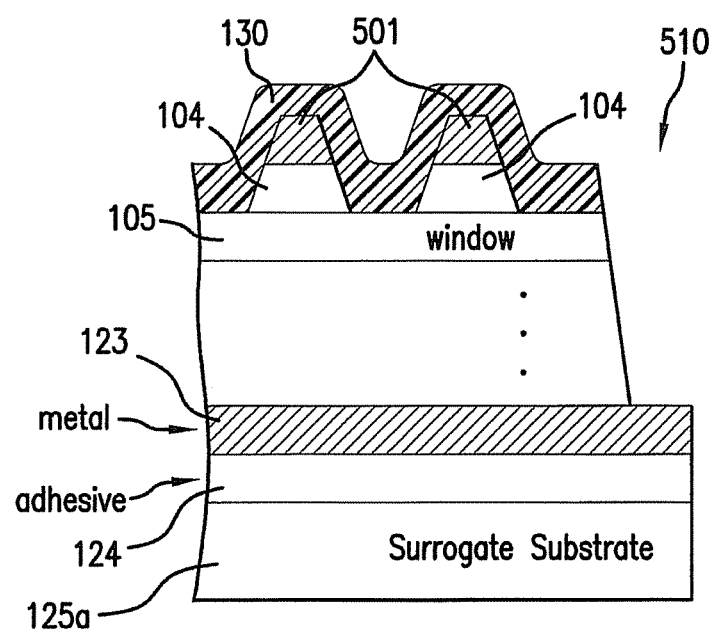
FIG. 14A is a cross-sectional view of the solar cell of FIG. 12 after the next process step in a first embodiment of the present invention.

FIG. 14A is a cross-sectional view of the solar cell of FIG. 12 after the next process step in a first embodiment of the present invention in which the surrogate substrate 125 is appropriately thinned to a relatively thin layer 125a, by grinding, lapping, or etching.

Figure 14B:
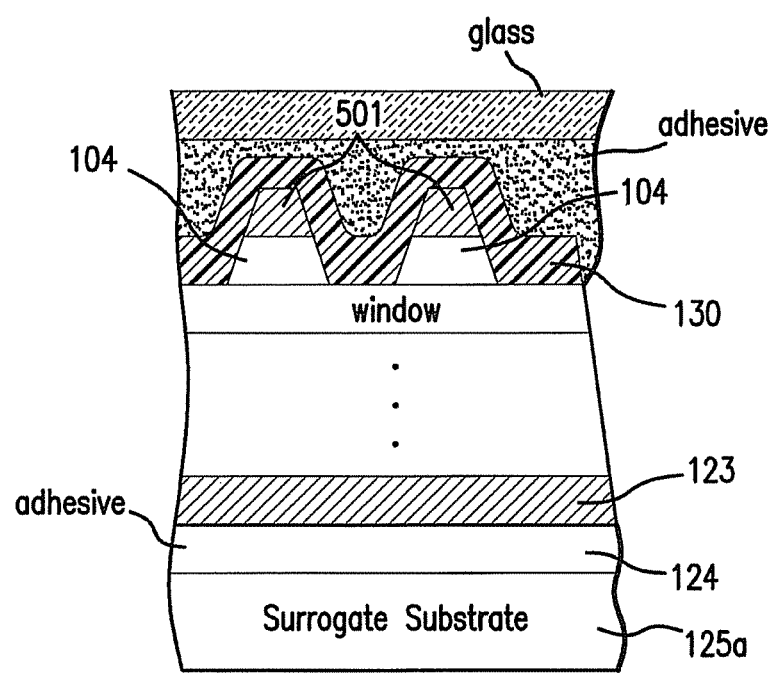
FIG. 14B is a cross-sectional view of the solar cell of FIG. 14A after the next process step in a second embodiment of the present invention.

FIG. 14B is a cross-sectional view of the solar cell of FIG. 14A after the next process step in a second embodiment of the present invention in which a cover glass is secured to the top of the cell by an adhesive.

Figure 15:
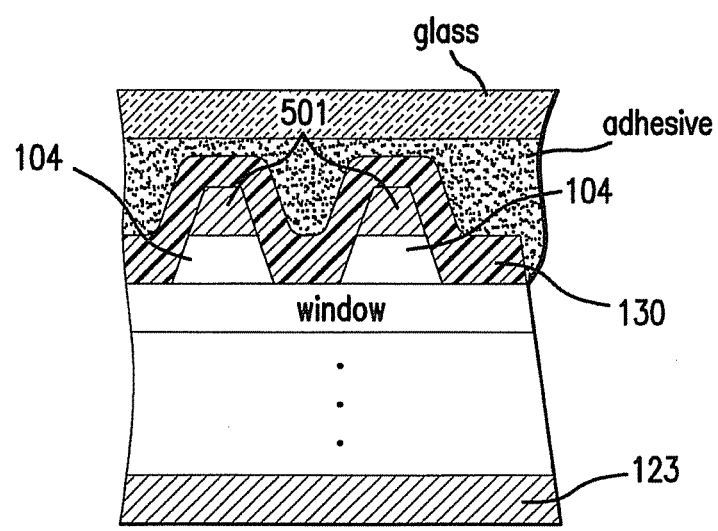
FIG. 15 is a cross-sectional view of the solar cell of FIG. 14B after the next process step in a third embodiment of the present invention.

FIG. 15 is a cross-sectional view of the solar cell of FIG. 14B after the next process step in a third embodiment of the present invention in which a cover glass is secured to the top of the cell and the surrogate substrate 125 is entirely removed, leaving only the metal contact layer 123 which forms the backside contact of the solar cell. The surrogate substrate may be reused in subsequent wafer processing operations.

Figure 16:
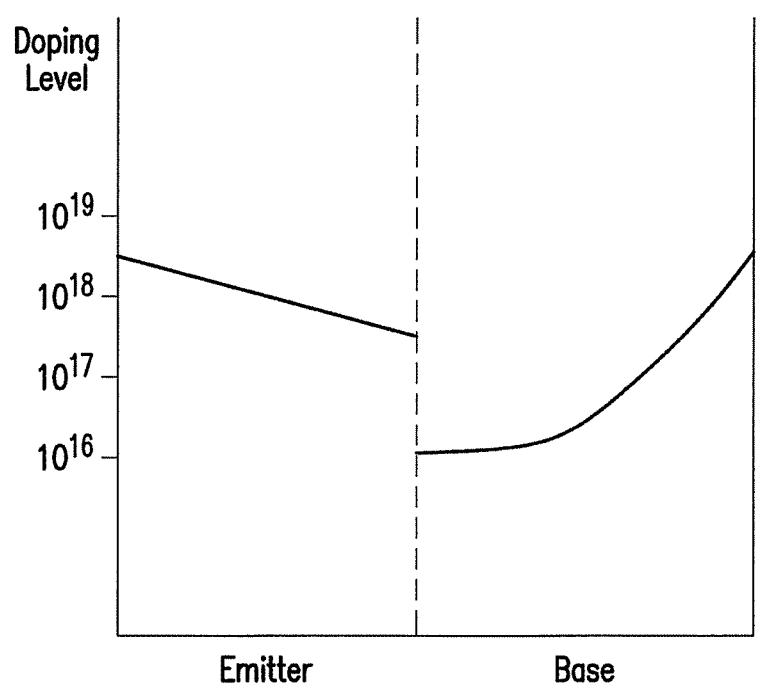
FIG. 16 is a graph of the doping profile in a base layer in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 17:
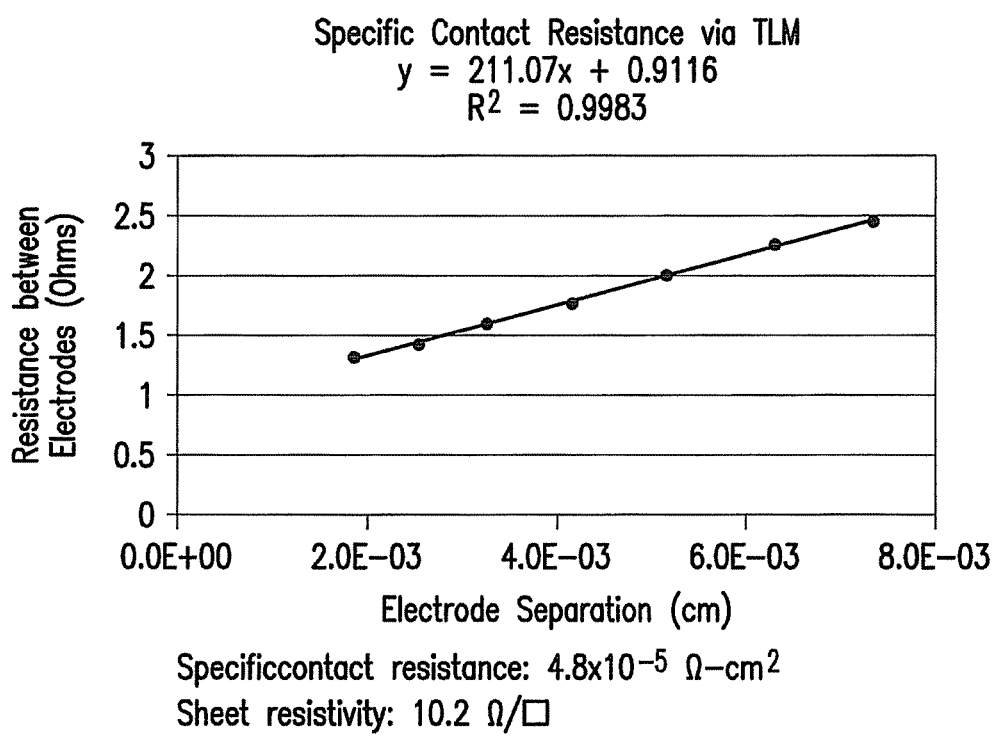
FIG. 17 is a graph that depicts the specific contact resistance of contact structures according to the present invention using the transmission line method.

FIG. 17 is a graph depicting the results of a TLM pattern measurement on wafers with contacts 501 formed with Pd/Ge/Ti/Pd/Au according to the present invention, with the resistance between electrodes (measured in ohms) shown as a function of the electrode separation, depicted along the x-axis.

It will be understood that each of the elements described above, or two or more together, also may find a useful application in other types of constructions differing from the types of constructions described above.

Although the preferred embodiment of the present invention utilizes a vertical stack of three subcells, the present invention can apply to stacks with fewer or greater number of subcells, i.e. two junction cells, four junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other electronic and optoelectronic devices, such as, transistors, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs and also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of forming a multijunction solar cell comprising a top subcell, at least one middle subcell, and a bottom subcell, the method comprising: forming a semiconductor contact layer composed of GaAs over the top subcell; depositing a metal contact layer including a germanium layer and a palladium layer over the semiconductor contact layer by e-beam evaporation; and forming an ohmic metal contact from the metal contact layer to the semiconductor contact layer having a specific contact resistance of less than $2 \times 10^{-4}$ ohms-cm$^2$, wherein the metal contact layer comprises a sequence of layers selected from of the group consisting of Pd/Ge/Au, Pd/Ge/Ag, Pd/Ge/Pt/Au, Pd/Ge/Pt/Ag, Pd/Ge/Pt/Ag/Au, Au/Ge/Pd/Au, Pd/Ge/Ti/Pd/Au, and Pd/Ge/Ti/Pd/Ag/Au;, and wherein the metal contact layer is heated at 210 degrees C. or less.

2. The method as defined in claim 1, wherein the palladium layer has a thickness of 50 nm and the germanium layer has a thickness of 100 nm.

3. The method as defined in claim 1, wherein the palladium layer is disposed adjacent to the semiconductor contact layer, and the germanium layer is disposed on top of the palladium layer.

4. The method as defined in claim 1, wherein the metal contact layer is heated for approximately 35 minutes or less.

5. The method as defined in claim 1, wherein the specific contact resistance between the metal contact layer and the semiconductor contact layer is less than $5\times10^{-6}$ ohms-cm$^2$.

6. The method as defined in claim 1, wherein the specific contact resistance is less than $1\times10^{-4}$ ohms-cm$^2$.

7. The method as defined in claim 1, wherein the heating is performed in ambient atmosphere on a hot plate.

8. The method as defined in claim 1, wherein the multijunction solar cell is a triple junction solar cell composed of III-V compound semiconductor material including the top subcell, the at least one middle subcell, and the bottom subcell, wherein the top subcell has a first band gap; the at least one middle subcell has a second band gap smaller than said first band gap; a graded interlayer is disposed over said at least one middle subcell that is compositionally graded to lattice match the at least one middle subcell on one side and the bottom subcell on the other side; the bottom subcell disposed over said graded interlayer has a fourth band gap smaller than said second band gap such that said bottom subcell is lattice mismatched with respect to said at least one middle subcell.

9. The method as defined in claim 8, wherein the upper subcell is composed of InGa(Al)P.

10. The method as defined in claim 8, wherein the at least one middle subcell is composed of an GaAs, GaInP, GaInAs, GaAsSb, or GaInAsN emitter region and a GaAs, GaInAs, GaAsSb, or GaInAsN base region.

11. The method as defined in claim 8, wherein the lower subcell is composed of an InGaAs base and emitter layer, or a InGaAs base layer and a InGaP emitter layer.

12. The method as defined in claim 8, wherein the graded interlayer is composed of InGaAlAs.

13. The method as defined in claim 8, wherein the graded interlayer has a band gap of approximately 1.5 eV throughout its thickness.

14. The method as defined in claim 8, wherein the graded interlayer is composed of any of the As, N, Sb based III-V compound semiconductors subject to a constraint of having an in-plane lattice parameter greater or equal to that of the second solar subcell and less than or equal to that of the second solar subcell and less than or equal to that of the third solar subcell, and having a band gap energy greater than that of the second solar subcell.

15. The method as defined in claim 8, wherein the graded interlayer is composed of $(In_xGa_{1-x})_yAl_{1-y}As$, with x and y selected such that the band gap of the transition material remains constant throughout its thickness.

16. The method as defined in claim 15, wherein said graded interlayer is composed of nine or more steps of layers of semiconductor material with monotonically changing lattice constant and constant band gap.

17. A method of forming a multijunction solar cell comprising a top subcell, at least one middle subcell, and a bottom subcell, the method comprising: forming a semiconductor contact layer composed of GaAs over the top subcell; depositing a metal contact layer including a germanium layer and a palladium layer over the semiconductor contact layer; and forming an ohmic metal contact from the metal contact layer to the semiconductor contact layer having a specific contact resistance of less than $2\times10^{-4}$ ohms-cm$^2$, wherein the metal contact layer comprises a sequence of layers selected from of the group consisting of Pd/Ge/Au, Pd/Ge/Ag, Pd/Ge/Pt/Au, Pd/Ge/Pt/Ag, Pd/Ge/Pt/Ag/Au, Au/Ge/Pd/Au, Pd/Ge/Ti/Pd/Au, and Pd/Ge/Ti/Pd/Ag/Au;, and wherein the metal contact layer is heated on a hot plate in ambient atmosphere.

18. The method as defined in claim 17, wherein the palladium layer is disposed adjacent to the semiconductor contact layer, and the germanium layer is disposed on top of the palladium layer.

19. The method as defined in claim 17, wherein the specific contact resistance between the metal contact layer and the semiconductor contact layer is less than $5\times10^{-6}$ ohms-cm$^2$.

20. The method as defined in claim 17, wherein the specific contact resistance is less than $1\times10^{-4}$ ohms-cm$^2$.

* * * * *